(12) United States Patent
Banba et al.

(10) Patent No.: US 9,386,696 B2
(45) Date of Patent: Jul. 5, 2016

(54) MULTILAYER CERAMIC SUBSTRATE AND MANUFACTURING METHOD THEREFOR

(71) Applicant: Murata Manufacturing Co., Ltd., Nagaokakyo-shi, Kyoto-fu (JP)

(72) Inventors: Shinichiro Banba, Nagaokakyo (JP); Yutaka Fukuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 385 days.

(21) Appl. No.: 14/136,004

(22) Filed: Dec. 20, 2013

(65) Prior Publication Data

US 2014/0110160 A1 Apr. 24, 2014

Related U.S. Application Data

(63) Continuation of application No. PCT/JP2012/066483, filed on Jun. 28, 2012.

(30) Foreign Application Priority Data

Jun. 29, 2011 (JP) .................................. 2011-143766

(51) Int. Cl.
*H05K 1/11* (2006.01)
*H05K 1/16* (2006.01)
(Continued)

(52) U.S. Cl.
CPC ................ *H05K 1/115* (2013.01); *G01R 1/203* (2013.01); *H05K 1/0306* (2013.01); *H05K 1/167* (2013.01); *H05K 3/4614* (2013.01); *G01R 3/00* (2013.01); *H05K 3/429* (2013.01); *H05K 3/4629* (2013.01); *H05K 2201/0269* (2013.01)

(58) Field of Classification Search
CPC ....... H05K 1/0234; H05K 1/16; H05K 1/115; H05K 1/0306; H05K 3/4614; H05K 1/167; H05K 3/4038; H05K 3/4061; H05K 3/4069; G01R 1/203; H02G 7/14; H02G 1/04
USPC .......................................................... 174/8
See application file for complete search history.

(56) References Cited

U.S. PATENT DOCUMENTS 3,909,680 A * 9/1975 Tsunashima ........... H05K 1/167
156/90
4,490,429 A * 12/1984 Tosaki .................... H01L 27/01
174/257

(Continued)

FOREIGN PATENT DOCUMENTS

CN 101358050 A 2/2009
JP 09-092983 A 4/1997
(Continued)

OTHER PUBLICATIONS

Official Communication issued in International Patent Application No. PCT/JP2012/066483, mailed on Oct. 2, 2012.

*Primary Examiner* — Steven T Sawyer
(74) *Attorney, Agent, or Firm* — Keating & Bennett, LLP

(57) ABSTRACT

A multilayer ceramic substrate includes a ceramic element body including a plurality of stacked ceramic layers, a resistor including a resistance film disposed between the ceramic layers, and a lead via conductor penetrating the ceramic layers in a thickness direction and connected at a first end portion to the resistance film. The resistance film and the lead via conductor both contain, for example, Ni and Cu that constitute an alloy resistive material. A concentration of the Ni component in the lead via conductor has a gradient structure that is comparatively high in the first end portion connected to the resistance film and gradually decreases from the first end portion toward a second end portion opposite therefrom.

17 Claims, 8 Drawing Sheets

(51) Int. Cl.
  *G01R 1/20*   (2006.01)
  *H05K 1/03*   (2006.01)
  *H05K 3/42*    (2006.01)
  *H05K 3/46*    (2006.01)
  *G01R 3/00*    (2006.01)

(56) References Cited

U.S. PATENT DOCUMENTS

| | | |
|---|---|---|
| 5,814,366 A | 9/1998 | Fukuta et al. |
| 6,201,286 B1* | 3/2001 | Nagasaka ............... H05K 1/167 |
| | | 257/528 |
| 2004/0144476 A1* | 7/2004 | Fukuta ................ H01L 21/4857 |
| | | 156/89.11 |
| 2005/0051360 A1* | 3/2005 | Su .......................... H01C 7/005 |
| | | 174/260 |
| 2008/0040920 A1* | 2/2008 | Brackenbury ......... H05K 1/167 |
| | | 29/832 |
| 2009/0032779 A1 | 2/2009 | Toyoda et al. |
| 2009/0084588 A1* | 4/2009 | Sekine ............. H01L 21/76898 |
| | | 174/257 |

FOREIGN PATENT DOCUMENTS

| | | |
|---|---|---|
| JP | 2002-015620 A | 1/2002 |
| JP | 2003-008227 A | 1/2003 |
| JP | 2004-119547 A | 4/2004 |
| JP | 2004-356306 A | 12/2004 |
| JP | 2006-140513 A | 6/2006 |
| JP | 2009-147157 A | 7/2009 |

* cited by examiner

MULTILAYER CERAMIC SUBSTRATE AND MANUFACTURING METHOD THEREFOR

BACKGROUND OF THE INVENTION

1. Field of the Invention

The present invention relates to a multilayer ceramic substrate and a manufacturing method therefor, and more particularly, to a multilayer ceramic substrate including a resistance film therein and a manufacturing method therefor.

2. Description of the Related Art

For example, to measure the remaining battery power with a remaining-battery-power detection circuit, a current detection resistor with an ultralow resistance of 100 mΩ or less is necessary. Further, the current detection resistor is required to have a TCR (temperature coefficient of resistance), for example, of less than 100 ppm/° C.

For example, Japanese Unexamined Patent Application Publication No. 2004-356306 discloses a ceramic substrate equipped with a resistor that is formed by firing a resistor paste simultaneously with the ceramic substrate. For example, a resistor paste used in Japanese Unexamined Patent Application Publication No. 2004-356306 is mainly composed of ruthenium oxide. However, in the case of a ruthenium oxide resistor paste, an ultralow resistance of 100 mΩ or less cannot be realized with excellent TCR characteristics.

Further, when the substrate has a resistance film therein, conductor films are connected as lead electrodes to both ends of the resistance film, as in the technique described in Japanese Unexamined Patent Application Publication No. 2004-356306. In this case, however, if the area of connecting portions between the resistance film and the conductor films is large, alloying in the connecting portions is not negligible, and this affects the TCR characteristics. For this reason, even if a resistive material, for example, containing Ni and Cu is selected to achieve excellent TCR characteristics at a low resistance, the TCR characteristics are affected by alloying in the connection portions between the resistance film and the conductor films. This makes it difficult to obtain desired characteristics.

To solve the above problems, it is conceivable to lead out the resistance film by using via conductors. In this case, since the cross-sectional area of the via conductors is sufficiently smaller than the area of the resistance film, the area of connecting portions between the resistance film and the via conductors can be made smaller than the area of the above-described connecting portions between the resistance film and the conductor films. Hence, it is possible to reduce the influence on the TCR characteristics due to alloying in the connecting portions. For example, Japanese Unexamined Patent Application Publication No. 2009-147157 discloses a structure in which via conductors are connected to an internal wire contained in a multilayer ceramic substrate, and also discloses that a resistor is formed similarly to the internal wire.

However, when the structure in which the resistance film is led out by the via conductors with the emphasis on realization of excellent TCR characteristics, as described above, the area of the connecting portions becomes small. This causes a problem in that connection reliability between the resistance film and the via conductors decreases.

SUMMARY OF THE INVENTION

Accordingly, preferred embodiments of the present invention provide a multilayer ceramic substrate and a manufacturing method therefor, which solve the above-described problems and realize an ultralow resistance of about 100 mΩ or less with excellent TCR characteristics and obtain high connection reliability between a resistance film and a via conductor even when a structure in which a resistance film is led out by the via conductor.

A multilayer ceramic substrate according to a preferred embodiment of the present invention includes a ceramic element body including a plurality of stacked ceramic layers, a resistor including a resistance film disposed between the ceramic layers, and a lead via conductor penetrating the ceramic layers in a thickness direction and connected at a first end portion to the resistance film. The resistance film and the lead via conductor both include at least a first metallic component and a second metallic component that constitute an alloy resistive material, and a concentration of the second metallic component in the lead via conductor has a gradient structure that is comparatively high in the first end portion connected to the resistance film and gradually decreases from the first end portion toward a second end portion opposite therefrom.

Preferably, the first metallic component is Cu and the second metallic component is Ni.

Preferably, the resistor includes a plurality of resistance films disposed between the plurality of ceramic layers, and a plurality of parallel connection via conductors that connect the plurality of resistance films in parallel, penetrate the ceramic layers in the thickness direction, and are disposed at different positions. This reduces resistance variations in the resistor. To further reduce resistance variations, preferably, the resistor includes three or more parallel connection via conductors.

Preferably, the parallel connection via conductors are made of the same material as a material of the resistance films. This significantly reduces or prevents diffusion of the components between the resistance films and the parallel connection via conductors. As a result, resistance variations are significantly reduced or prevented, and excellent TCR characteristics are obtained.

Preferably, the ceramic layers are mainly composed of $BaO$, $SiO_2$, and $Al_2O_3$, for example. Particularly when the resistance film and the lead via conductor contain Cu, the ceramic layers mainly composed of $BaO$, $SiO_2$, and $Al_2O_3$ are suited to be fired simultaneously with the resistance film and the via conductor in a reducing atmosphere.

Preferably, a multilayer ceramic substrate according to a preferred embodiment of the present invention further includes a connection conductor film disposed between the ceramic layers and connected to the second end portion of the lead via conductor at a first position, and a terminal conductor including a terminal via conductor connected to the connection conductor film at a second position different from the first position, penetrating the ceramic layers in the thickness direction, and led onto an outer surface of the multilayer ceramic substrate. According to the distance given by the above connection conductor film, the second metallic component in the resistance film is prevented from diffusing and reaching the terminal conductor. Therefore, particularly when the second metallic component is Ni, solderability in the terminal conductor is prevented from being reduced by Ni.

A multilayer ceramic substrate according to a preferred embodiment of the present invention further includes first and second source terminals and first and second sense terminals, and advantageously includes a resistive element with a completely four-terminal structure in which first and second lead via conductors are electrically connected to the first and second sense terminals, respectively, and the first and second source terminals are electrically connected to positions of the resistance film between which connecting portions to the first and second lead via conductors are located.

According to another preferred embodiment of the present invention, a manufacturing method for a multilayer ceramic substrate having the above-described structure is provided.

To perform a manufacturing method for a multilayer ceramic substrate according to a preferred embodiment of the present invention, first, a plurality of ceramic green sheets are prepared, and a resistor paste including an alloy resistive material containing a first metallic component and a second metallic component and a conductor paste mainly composed of at least the first metallic component are prepared. Then, a lead via conductor is formed by the conductor paste in a specific ceramic green sheet of the ceramic green sheets.

A resistance film to be connected to an end portion of the lead via conductor is formed by the resistor paste on a principal surface of a ceramic green sheet. In this case, the resistance film may be formed on the ceramic green sheet in which the lead via conductor is formed, or may be formed on a ceramic green sheet adjacent to the ceramic green sheet in which the lead via conductor is formed so that the resistance film is connected to the lead via conductor when the ceramic green sheets are stacked.

Next, a step of forming a laminated body by stacking the ceramic green sheets is performed, and after that, a step of firing the laminated body is performed.

In the above-described firing step, the lead via conductor is caused to contain the first metallic component and the second metallic component by diffusing the second metallic component contained in the resistance film into the lead via conductor, and a gradient structure in which the second metallic component gradually decreases from a first end portion toward a second end portion is formed, as described above.

When the conductor paste further contains the second metallic component, in the step of preparing the conductor paste, a plurality of kinds of conductor pastes that are different in a content ratio of the first metallic component and the second metallic component are preferably prepared. In the step of forming the lead via conductor, a lead via conductor is formed in each of the ceramic green sheets by any of the plural kinds of the conductor pastes so that a plurality of kinds of ceramic green sheets that are different in the content ratio of the first metallic component and the second metallic component in the lead via conductor are obtained. In the step of forming the laminated body, the ceramic green sheets may be stacked such that the ceramic green sheet including the lead via conductor having the highest content of the second metallic component is located on a side connected to the resistance film and such that the ceramic green sheets are arranged from the resistance film in order of decreasing content of the second metallic component in the lead via conductor.

When the manufacturing method for the multilayer ceramic substrate according to a preferred embodiment of the present invention is performed as described above, since the lead via conductor contains the second metallic component such that the content of the second metallic component has a gradient, diffusion of the second metallic component in the resistance film is significantly reduced or prevented during firing, and this stabilizes the resistance characteristics. Further, since diffusion of the second metallic component is significantly reduced or prevented, the second end portion of the lead via conductor opposite from the resistance film is unlikely to contain the second metallic component. This is advantageous when the second metallic component is Ni. That is, Ni is prevented from reducing solderability when the second end portion of the lead via conductor is exposed to the surface of the multilayer ceramic substrate so as to be used as a surface electrode for connection of a mount component.

According to a preferred embodiment of the present invention, since the resistance film included in the resistor is formed of the alloy resistive material containing the first metallic component and the second metallic component, an ultralow resistance of about 100 m$\Omega$ or less can be realized with excellent TCR characteristics, for example.

The lead via conductor is connected to the resistance film to lead out the resistor, and the lead via conductor is formed of the conductor paste mainly composed of the first metallic component that constitutes the alloy resistive material. Hence, undesirable diffusion of the component from the lead via conductor to the resistance film is unlikely to occur during firing. Therefore, it is possible to stably maintain excellent resistance characteristics of the resistance film such as excellent TCR characteristics.

Since the conductor paste that defines the lead via conductor and the resistance film commonly contain the first metallic component that constitutes the alloy resistive material, the second metallic component contained in the resistance film is likely to diffuse to the lead via conductor. For this reason, the concentration of the second metallic component in the lead via conductor has a gradient structure that is comparatively high in the first end portion connected to the resistance film and gradually decreases from the first end portion toward the second end portion. Hence, even when the connection area is small, high connection strength can be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
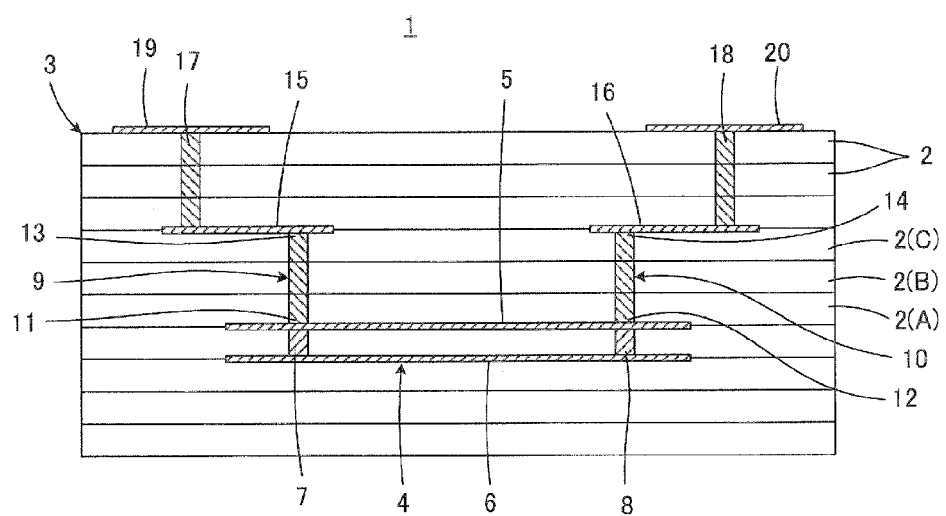
FIG. 1 is a cross-sectional view of a multilayer ceramic substrate 1 according to a first preferred embodiment of the present invention.

A multilayer ceramic substrate 1 according to a first preferred embodiment of the present invention will be described with reference to FIG. 1.

The multilayer ceramic substrate 1 includes a ceramic element body 3 including a plurality of stacked ceramic layers 2. In the ceramic element body 3, a resistor 4 is disposed.

The resistor 4 includes a plurality of resistance films disposed between the plural ceramic layers 2, for example, two resistance films 5 and 6, and a plurality of parallel connection via conductors that connect the resistance films 5 and 6 in parallel, penetrate the ceramic layers 2 in a thickness direction, and are disposed at different positions, for example, two parallel connection via conductors 7 and 8. The parallel connection via conductors 7 and 8 are preferably made of the same material as that of the resistance films 5 and 6. This significantly reduces or prevents diffusion of components between the resistance films 5 and 6 and the parallel connection via conductors 7 and 8. As a result, resistance variations are reduced, and excellent TCR characteristics are obtained.

From a viewpoint of reducing the above-described resistance variations, the number of each of the parallel connection via conductors 7 and 8 is preferably large (see FIGS. 13 to 16). As for one of the parallel connection via conductors, that is, the parallel connection via conductor 7, it is more preferable to arrange, for example, two parallel connection via conductors 7 in a direction orthogonal to the plane of FIG. 1 than to dispose only one parallel connection via conductor 7. Therefore, more resistance variations are reduced when the total number of parallel connection via conductors 7 and 8 is three or more than when the number of each of the parallel connection via conductors 7 and 8 is at least one.

In the ceramic element body 3, lead via conductors 9 and 10 are also disposed to lead the resistor 4 to other circuit elements. The lead via conductors 9 and 10 penetrate the ceramic layers 2 in the thickness direction, and first end portions 11 and 12 thereof are connected to the resistance film 5.

As a characteristic structure of the present invention, in this preferred embodiment, the resistance films 5 and 6 and the lead via conductors 9 and 10 both contain, for example, Ni and Cu that constitute an alloy resistive material. The concentration of a Ni component in the lead via conductors 9 and 10 has a gradient structure that is comparatively high in the first end portions 11 and 12 connected to the resistance film 5 and gradually decreases from the first end portions 11 and 12 toward second end portions 13 and 14 opposite therefrom.

According to the above-described structure, as is known from below-described experimental examples, an ultralow resistance of about 100 mΩ or less is realized with excellent TCR characteristics in the resistor 4. Moreover, even when the lead via conductors 9 and 10 are connected to the resistance film 5 with small connection areas, high connection strength is obtained.

Since the plural resistance films 5 and 6 are connected in parallel by the parallel connection via conductors 7 and 8, resistance variations in the resistor 4 are reduced, as is known from the below-described experimental examples.

The multilayer ceramic substrate 1 further includes connection conductor films 15 and 16 disposed between the ceramic layers 2 and connected to the second end portions 13 and 14 of the lead via conductors 9 and 10, respectively, at a first position. The multilayer ceramic substrate 1 further includes terminal conductors defined by terminal via conductors 17 and 18 and terminal electrodes 19 and 20. The terminal via conductors 17 and 18 are connected to the connection conductor films 15 and 16, respectively, at a second position different from the first position and penetrate the ceramic layers 2 in the thickness direction to be led onto an outer surface of the multilayer ceramic substrate 1. The terminal electrodes 19 and 20 are connected to the terminal via conductors 17 and 18, respectively, and are disposed on a principal surface of the multilayer ceramic substrate 1.

For example, the multilayer ceramic substrate 1 is manufactured as follows.

First, a plurality of ceramic green sheets to become ceramic layers 2 are prepared. More specifically, ceramic green sheets having a thickness of about 25 μm to about 100 μm are prepared, which are obtained by coating carrier films formed by, for example, PET films with ceramic slurry mainly composed of BaO, $SiO_2$, and $Al_2O_3$ and drying the ceramic slurry. Here, when the ceramic layers 2 are mainly composed of BaO, $SiO_2$, and $Al_2O_3$, they can be suited to be fired simultaneously with resistance films 5 and 6 and lead via conductors 9 and 10 containing Cu in a reducing atmosphere.

To form resistance films 5 and 6, a resistor paste containing Cu and Ni is prepared. More specifically, a resistor paste is prepared by kneading metallic powder, which contains 45 wt % to 85 wt % Cu powder and 55 wt % to 15 wt % Ni powder, resin, and an organic solvent. By printing the resistor paste on specific ceramic green sheets, resistance films 5 and 6 are formed. The thickness of each of the resistance films 5 and 6 is 10 μm to 30 μm in a dry film thickness.

As the metallic powder contained in the above-described resistor paste, Cu—Ni alloy powder can be used.

By using the above-described resistor paste, parallel connection via conductors 7 and 8 are formed in a specific ceramic green sheet.

On the other hand, a conductor paste mainly composed of Cu is prepared. More specifically, a conductor paste is prepared by kneading Cu powder, resin, and an organic solvent.

Through holes are formed in specific ceramic green sheets. Various known methods, such as punching with a die or laser machining, are applicable to formation of the through holes. The through holes are filled with the above-described conductor paste, and the conductor paste is dried, so that lead via conductors 9 and 10 are formed.

In specific ceramic green sheets, connection conductor films 15 and 16, terminal via conductors 17 and 18, and terminal electrodes 19 and 20 are formed by a conductor paste mainly composed of Cu.

Next, a laminated body is formed by stacking the plural ceramic green sheets in a predetermined order. At this time, the ceramic green sheets are stacked such that the lead via conductors 9 and 10 are connected to the resistance film 5.

Next, a step of firing the laminated body in a reducing atmosphere is performed. More specifically, the firing step is performed at a temperature of about 1000° C. in $N_2$. In this firing step, Ni contained in the resistance film 5 is diffused into the lead via conductors 9 and 10. As a result, the lead via conductors 9 and 10 contain Cu and Ni, and a gradient structure in which the Ni component gradually decreases from first end portions 11 and 12 toward second end portions 13 and 14 is formed.

The connection conductor films 15 and 16 act to prevent Ni in the resistance film 5 from diffusing through the terminal via conductors 17 and 18 and reaching the terminal electrodes 19 and 20 by distances given by the films 15 and 16. As a result, the connection conductor films 15 and 16 act to prevent Ni from reducing solderability at the terminal electrodes 19 and 20.

The above-described firing method may be performed by a so-called constraint firing method in which firing is performed with a shrinkage suppressing layer mainly composed of a nonsinterable material, which is substantially not sintered at a firing temperature of the laminated body, being placed on both or one of the principal surfaces of the laminated body to be subjected to the firing step.

Next, if necessary, for example, electroless Ni plating and electroless Au plating are conducted on the terminal electrodes 19 and 20 in order so as to form a Ni plated film and an Au plated film covering the Ni plated film.

A multilayer ceramic substrate 1 is completed as described above.

Instead of the above-described manufacturing method, the following method may be adopted to obtain a gradient structure of a Ni component in the lead via conductors 9 and 10.

As conductor paste for forming lead via conductors 9 and 10, a plurality of kinds of conductor pastes having different content ratios of Cu and Ni are prepared. For example, a first conductor paste containing 80 wt % Cu and 20 wt % Ni, a second conductor paste containing 90 wt % Cu and 10 wt % Ni, and a third conductor paste containing 100 wt % Cu and 0 wt % Ni are prepared.

Next, when the lead via conductors 9 and 10 are formed, they are formed in each of a plurality of ceramic green sheets by using any of the above-described plural kinds of conductor pastes, so that a plurality of kinds of ceramic green sheets, which are different in the content ratio of Cu and Ni in the lead via conductors 9 and 10, are obtained.

For example, when lead via conductors 9 and 10 are formed to extend through three ceramic layers 2, as illustrated in FIG. 1, three ceramic green sheets are selected. To form the lead via conductors 9 and 10, the above first conductor paste is used in a first ceramic green sheet, the above second conductor paste is used in a second ceramic green sheet, and the above third conductor paste is used in a third ceramic green sheet.

Next, when a laminated body is formed, a plurality of ceramic green sheets are stacked such that a ceramic green sheet including lead via conductors 9 and 10 having the highest Ni content is located on a side connected to the resistance film 5 and such that the ceramic green sheets are arranged from the resistance film in order of decreasing Ni content in the lead via conductors 9 and 10.

More specifically, in FIG. 1, the first ceramic green sheet, which includes the lead via conductors 9 and 10 formed of the first conductor paste, is used as a ceramic layer 2(A) in contact with the resistance film 5. Next, the second ceramic green sheet, which includes the lead via conductors 9 and 10 formed of the second conductor paste, is used as a ceramic green sheet to be a ceramic layer 2(B) located on the ceramic layer 2(A). Next, the third ceramic green sheet, which includes the lead via conductors 9 and 10 formed of the third conductor paste, is used as a ceramic green sheet to be a ceramic layer 2(C) located on the ceramic layer 2(B).

As described above, the laminated body is obtained in which the lead via conductors 9 and 10 originally contain the Ni component such that the content of the Ni component has a gradient. When such a laminated body is fired, diffusion of Ni in the resistance film 5 during firing is significantly reduced or prevented, and resistance characteristics are stabilized. Further, since diffusion of Ni is significantly reduced or prevented, Ni can be unlikely to be contained in the second end portions 13 and 14 of the lead via conductors 9 and 10 opposite from the resistance film 5. Hence, even when the connection conductor films 15 and 16 are omitted, solderability of the terminal electrodes 19 and 20 is not impaired.

Figure 2:
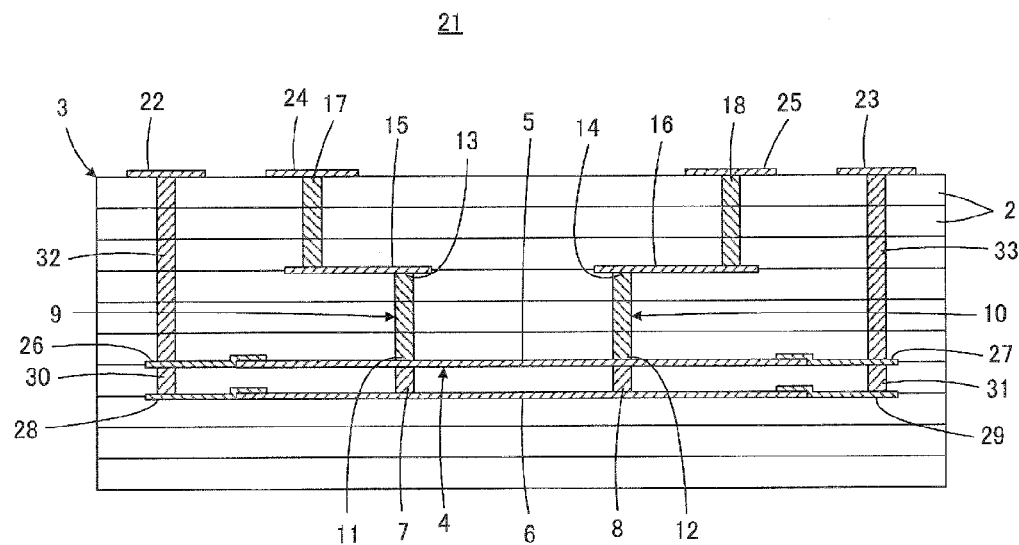
FIG. 2 is a cross-sectional view of a multilayer ceramic substrate 21 according to a second preferred embodiment of the present invention.

A multilayer ceramic substrate 21 according to a second preferred embodiment of the present invention will be described with reference to FIG. 2. In FIG. 2, elements corresponding to the elements illustrated in FIG. 1 are denoted by similar reference numerals, and redundant descriptions thereof are skipped.

The multilayer ceramic substrate 21 illustrated in FIG. 2 constitutes a resistive element having a complete four-terminal structure, and includes first and second source terminals 22 and 23 and first and second sense terminals 24 and 25 disposed on a principal surface of a ceramic element body 3.

The terminal electrodes 19 and 20 in the multilayer ceramic substrate 1 illustrated in FIG. 1 correspond to the first and second sense terminals 24 and 25, respectively. Therefore, first and second lead via conductors 9 and 10 are electrically connected to the first and second sense terminals 24 and 25, respectively.

First and second lead conductor films 26 and 27 are provided in contact with a resistance film 5 at positions between which connecting portions of the resistance film 5 to the first and second lead via conductors 9 and 10 are located. Third and fourth lead conductor films 28 and 29 are provided in contact with a resistance film 6 at positions between which connecting portions of the resistance film 6 to first and second parallel connection via conductors 7 and 8 are located.

The first and third lead conductor films 26 and 28 are connected in parallel by a parallel connection via conductor 30, and are also connected to the first source terminal 22 via a first terminal via conductor 32. The second and fourth lead conductor films 27 and 29 are connected in parallel by a parallel connection via conductor 31, and are also connected to the second source terminal 23 via a second terminal via conductor 33.

According to this multilayer ceramic substrate 21, the current flowing between the first and second source terminals 22 and 23 through a resistor 4 is sensed preferably by measuring the voltage between the first and second sense terminals 24 and 25.

Figure 3:
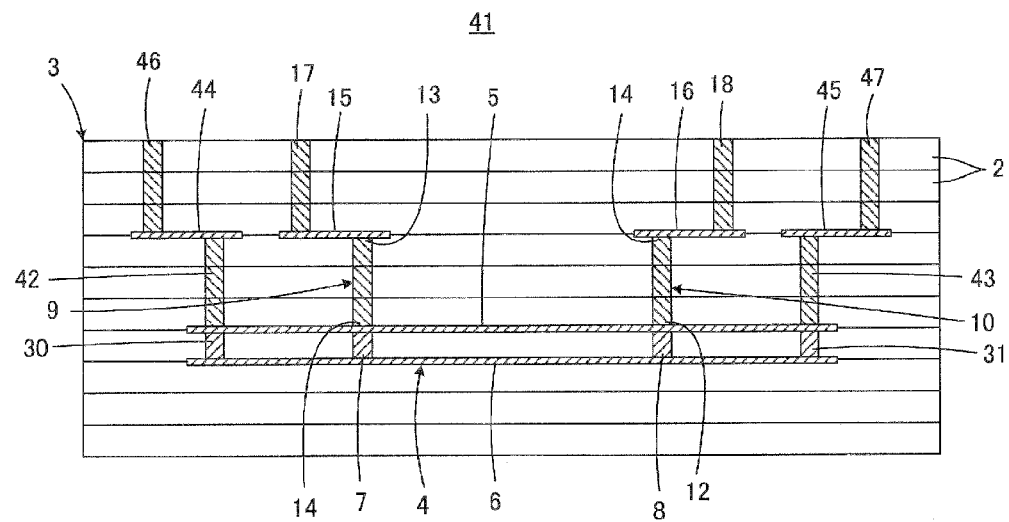
FIG. 3 is a cross-sectional view of a multilayer ceramic substrate 41 according to a third preferred embodiment of the present invention.

A multilayer ceramic substrate 41 according to a third preferred embodiment of the present invention will be described with reference to FIG. 3. The multilayer ceramic substrate 41 illustrated in FIG. 3 is a modification of the multilayer ceramic substrate 21 illustrated in FIG. 2. In FIG. 3, elements corresponding to the elements illustrated in FIG. 2 are denoted by similar reference numerals, and redundant descriptions thereof are skipped.

In the multilayer ceramic substrate 41 illustrated in FIG. 3, lead via conductors 42 and 43 are provided instead of the lead conductor films 26 and 27. The lead via conductors 42 and 43 preferably have a gradient structure of a Ni component, similarly to lead via conductors 9 and 10. To the lead via conductors 42 and 43, terminal via conductors 46 and 47 are connected via connection conductor films 44 and 45, respectively. The connection conductor films 44 and 45 act to prevent diffusion of Ni, similarly to connection conductor films 15 and 16.

In the multilayer ceramic substrate 41 illustrated in FIG. 3, first and second source terminals 22 and 23 are defined by exposed end surfaces of the first and second terminal via conductors 46 and 47, respectively. Similarly, first and second sense terminals 24 and 25 are defined by exposed end surfaces of first and second terminal via conductors 17 and 18, respectively.

The size of the multilayer ceramic substrate 41 illustrated in FIG. 3 can be made smaller than that of the multilayer ceramic substrate 21 illustrated in FIG. 2.

While the resistor paste preferably contains Cu and Ni in the above-described preferred embodiments, it may contain Cu and Mn or Cu and Zn, for example. Further, the resistor paste may contain at least one of Cr, M, and Fe as an accessory component, for example. According to these accessory components, an effect of increasing the resistance value is expected. By adding a tiny amount of Mn, a thermoelectromotive effect (thermocouple effect) at the connecting portions between the lead via conductors 9 and 10 and the resistance film 5 is significantly reduced or prevented, and this stabilizes the resistance value. Alternatively, a resistor paste containing Ag and Pd may be used such that lead via conductors contain Ag and Pd, and the concentration of Pd has a gradient structure.

While the lead via conductors 9 and 10 and the parallel connection via conductors 7 and 8 are preferably aligned on the same axes, they may be shifted to different positions.

Non-limiting experimental examples that confirm the advantages of various preferred embodiments of the present invention will be described below.

Experimental Example 1

Figure 4:
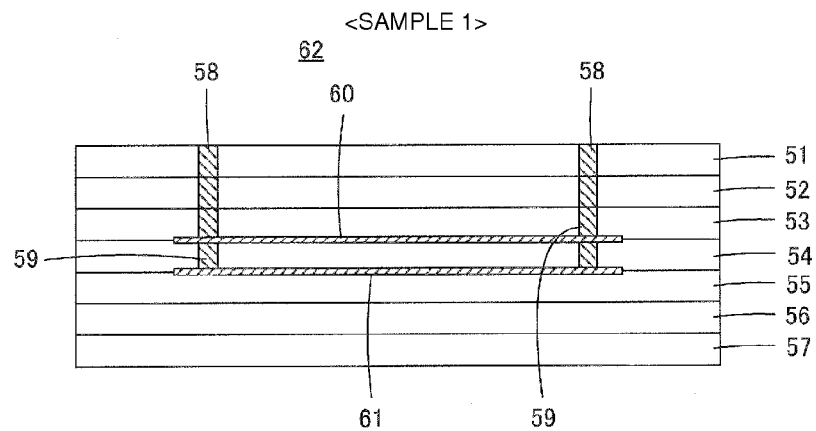
FIG. 4 is a cross-sectional view illustrating a laminated structure in an unfired state of Sample 1 manufactured in Experimental Example 1.
Figure 6:
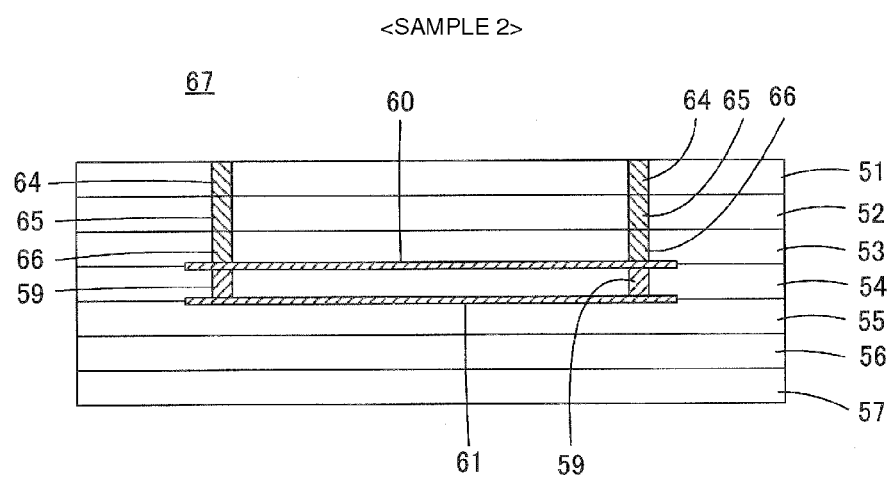
FIG. 6 is a cross-sectional view illustrating a laminated structure in an unfired state of Sample 2 manufactured in Experimental Example 1.
Figure 7:
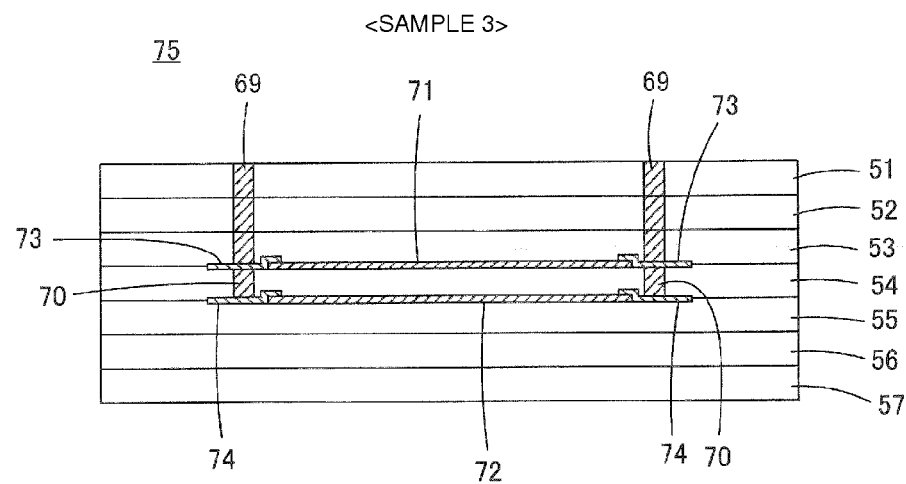
FIG. 7 is a cross-sectional view illustrating a laminated structure in an unfired state of Sample 3 manufactured in Experimental Example 1.

In Experimental Example 1, Sample 1 illustrated in FIG. 4, Sample 2 illustrated in FIG. 6, and Sample 3 illustrated in FIG. 7 were manufactured, and in particular, TCR characteristics were compared thereamong.
Sample 1

As illustrated in FIG. 4, seven ceramic green sheets 51 to 57 with a thickness of 50 µm were formed using a ceramic material mainly composed of BaO, $SiO_2$, and $Al_2O_3$.

Next, two through holes with a diameter of 100 µm were formed in the four ceramic green sheets 51 to 54.

Next, the through holes in the three ceramic green sheets 51 to 53, of the ceramic green sheets 51 to 54 in which the through holes were formed, were filled with a conductor paste made by kneading metallic powder containing 100 wt % Cu powder, resin, and an organic solvent to form lead via conductors 58.

In contrast, the through holes of the ceramic green sheet 54 were filled with a resistor paste made by kneading metallic powder containing 70 wt % Cu powder and 30 wt % Ni powder, resin, and an organic solvent to form parallel connection via conductors 59.

Figure 5:
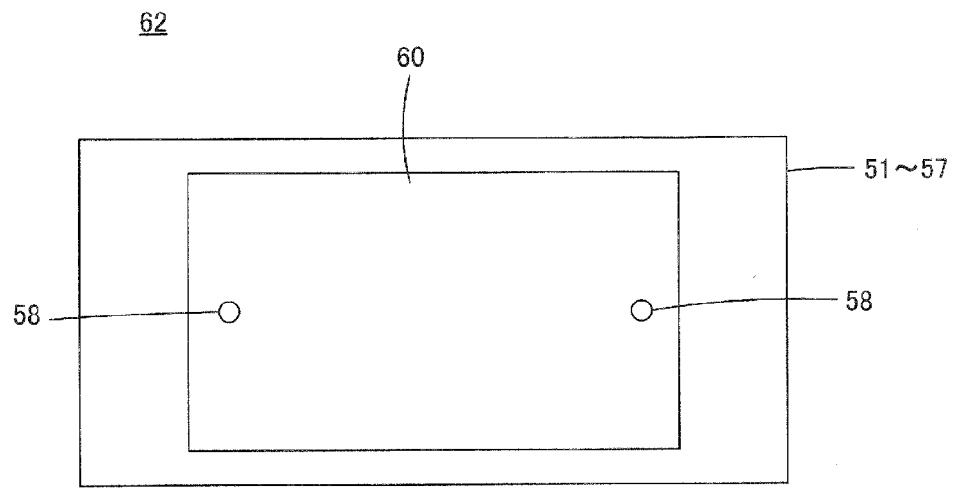
FIG. 5 illustrates a planar arrangement state of a resistance film 60 and lead via conductors 58 in Sample 1 illustrated in FIG. 4.

Resistance films 60 and 61 with a dry film thickness of 20 µm were formed on the ceramic green sheets 54 and 55, respectively, by using the above resistor paste. FIG. 5 illustrates a planar arrangement state of the resistance film 60 and the lead via conductors 58.

Next, the above ceramic green sheets 51 to 57 were stacked in the order illustrated in FIG. 4, and were pressure-bonded to obtain a laminated body 62.

Next, the laminated body 62 was fired at a temperature of about 1000° C. in $N_2$, and a multilayer ceramic substrate according to Sample 1 was obtained.
Sample 2

In a manner similar to that adopted for Sample 1, seven ceramic green sheets 51 to 57 with a thickness of 50 µm were formed, as illustrated in FIG. 6.

Next, similarly to Sample 1, two through holes with a diameter of 100 µm were formed in the four ceramic green sheets 51 to 54.

Next, the through holes in the ceramic green sheet 51, of the ceramic green sheets 51 to 54 in which the through holes were formed, were filled with a conductor paste made by kneading metallic powder containing 100 wt % Cu powder, resin, and an organic solvent to form lead via conductors 64. The through holes in the ceramic green sheet 52 were filled with a conductor paste made by kneading metallic powder containing 90 wt % Cu powder and 10 wt % Ni powder, resin, and an organic solvent to form lead via conductors 65. The through holes in the ceramic green sheet 53 were filled with a conductor paste made by kneading metallic powder containing 80 wt % Cu powder and 20 wt % Ni powder, resin, and an organic solvent to form lead via conductors 66.

In contrast, the through holes in the ceramic green sheet 54 were filled with a conductor paste made by kneading metallic powder containing 70 wt % Cu powder and 30 wt % Ni powder, resin, and an organic solvent to form parallel connection via conductors 59.

Similarly to Sample 1, resistance films 60 and 61 were formed on the ceramic green sheets 54 and 55, respectively.

After that, a laminated body 67 according to Sample 2 was obtained through an operation similar to that adopted in Sample 1 and was fired under conditions similar to those adopted in Sample 1, so that a multilayer ceramic substrate according to Sample 2 was obtained.
Sample 3

As illustrated in FIG. 7, similarly to Sample 1, seven ceramic green sheets 51 to 57 with a thickness of 50 µm were formed.

Next, similarly to Sample 1, two through holes with a diameter of 100 µm were formed in the four ceramic green sheets 51 to 54.

Next, the through holes of the ceramic green sheets 51 to 54 were filled with a conductor paste made by kneading metallic powder containing 100 wt % Cu powder, resin, and an organic solvent to form lead via conductors 69 and parallel connection via conductors 70.

Resistance films 71 and 72 with a dry film thickness of 20 µm were formed on the ceramic green sheets 54 and 55, respectively, by using a resistor paste made by kneading metallic powder containing 70 wt % Cu powder and 30 wt % Ni powder, resin, and an organic solvent.

Figure 8:
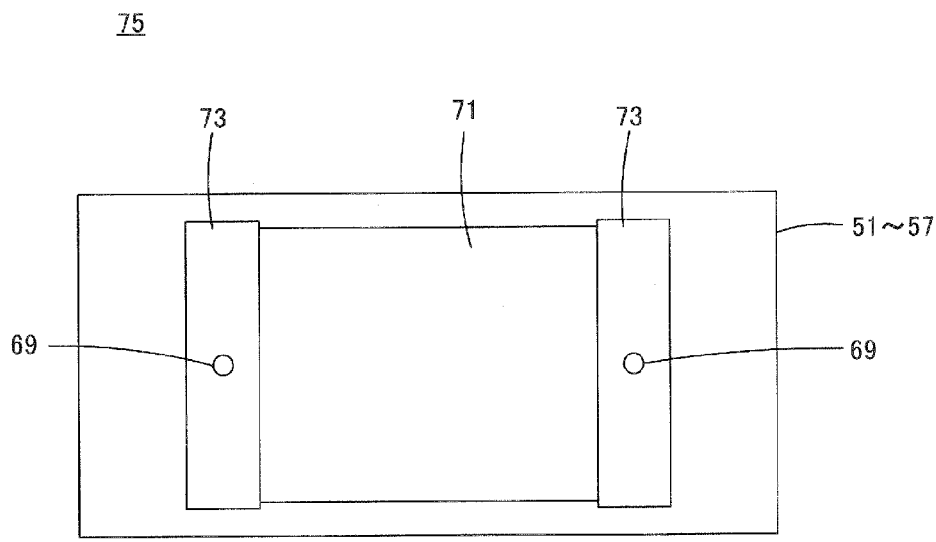
FIG. 8 illustrates a planar arrangement state of a resistance film 71, lead conductor films 73, and lead via conductors 69 in Sample 3 illustrated in FIG. 7.

Next, lead conductor films 73 and 74 were formed by a conductor paste made by kneading metallic powder containing 100 wt % Cu powder, resin, and organic solvent such that the lead conductor films 73 and 74 cover both ends of the resistance films 71 and 72. FIG. 8 illustrates a planar arrangement state of the resistance film 71, the lead conductor films 73, and the lead via conductors 69.

Next, a laminated body 75 was obtained by stacking and pressure-bonding the ceramic green sheets 51 to 57 in the order illustrated in FIG. 7.

Next, the laminated body 75 was fired under conditions similar to those of Sample 1, and a multilayer ceramic substrate according to Sample 3 was obtained.
Evaluation TCR characteristics of the resistor given by the resistance films in the multilayer ceramic substrates of Samples 1 to 3 thus obtained were evaluated. The TCR average of ten Samples 3 was 400 ppm/° C., whereas the TCR average of ten Samples 1 was 100 ppm/° C., and the TCR average of ten Samples 2 was 50 ppm/° C. Thus, good results were obtained.

Experimental Example 2

Figure 9:
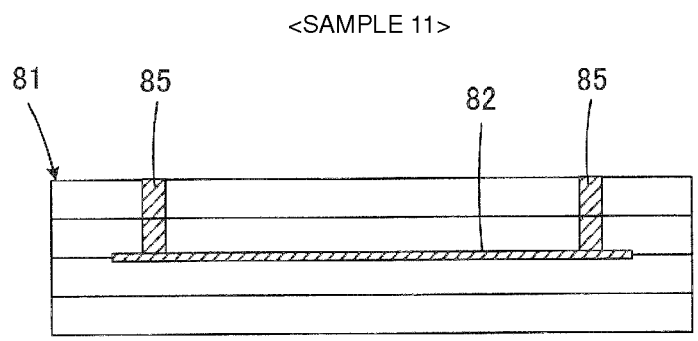
FIG. 9 illustrates a cross-sectional structure of Sample 11 manufactured in Experimental Example 2.
Figure 10:
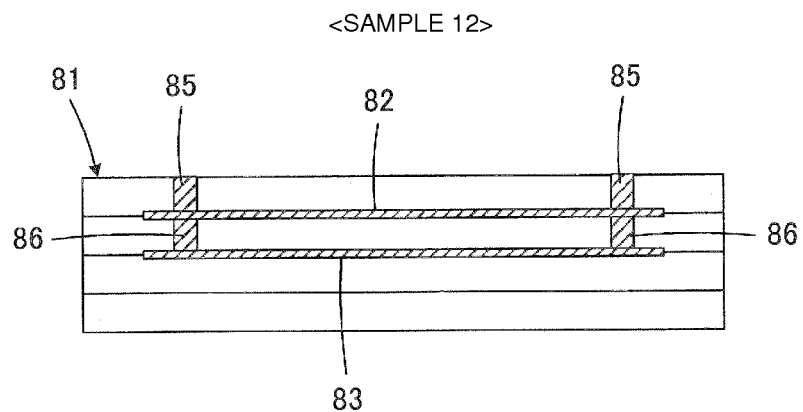
FIG. 10 illustrates a cross-sectional structure of Sample 12 manufactured in Experimental Example 2.
Figure 11:
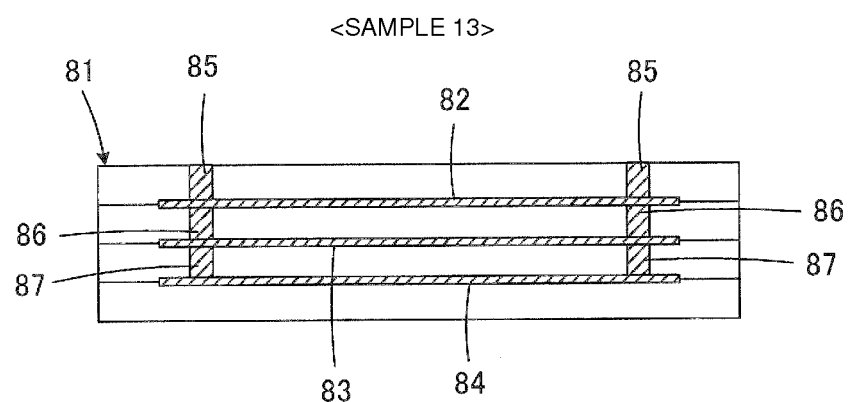
FIG. 11 illustrates a cross-sectional structure of Sample 13 manufactured in Experimental Example 2.

In Experimental Example 2, Sample 11 illustrated in FIG. 9, Sample 12 illustrated in FIG. 10, and Sample 13 illustrated in FIG. 11, which were different in the number of resistance films, were manufactured, and resistance variations were compared thereamong.

In Experimental Example 2, Samples 11 to 13 were manufactured by using ceramic green sheets that were similar in the material and thickness to those adopted in Sample 1 of Experimental Example 1, forming resistance films that were similar in the material and thickness, forming lead via conductors and parallel connection via conductors that are similar in the material and dimensions, and performing firing under similar conditions.

Sample 11

As illustrated in FIG. 9, Sample 11 is a multilayer ceramic substrate in which one resistance film 82 is formed in a ceramic element body 81 and is led out by lead via conductors 85.

Sample 12

As illustrated in FIG. 10, Sample 12 is a multilayer ceramic substrate in which two resistance films 82 and 83 are formed in a ceramic element body 81, are connected in parallel by parallel connection via conductors 86, and are led out by lead via conductors 85.

Sample 13

As illustrated in FIG. 11, Sample 13 is a multilayer ceramic substrate in which three resistance films 82, 83, and 84 are formed in a ceramic element body 81, are connected in parallel by parallel connection via conductors 86 and 87, and are led out by lead via conductors 85.

Evaluation

Figure 12:
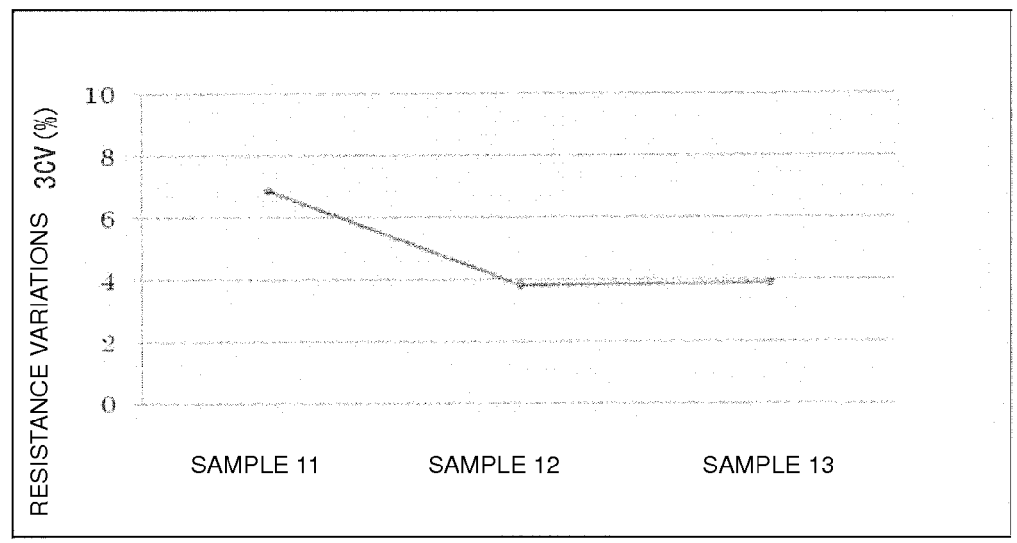
FIG. 12 illustrates resistance variations among Samples 11 to 13 manufactured in Experimental Example 2.

FIG. 12 illustrates resistance variations among Samples 11 to 13. As is known from FIG. 12, resistance variations could be reduced in Samples 12 and 13 in which a plurality of resistance films were connected in parallel, compared with Sample 11 in which one resistance film was simply formed. A significant difference was not found between Sample 12 in which two resistance films were connected in parallel and Sample 13 in which three resistance films were connected in parallel.

Experimental Example 3

Figure 13:
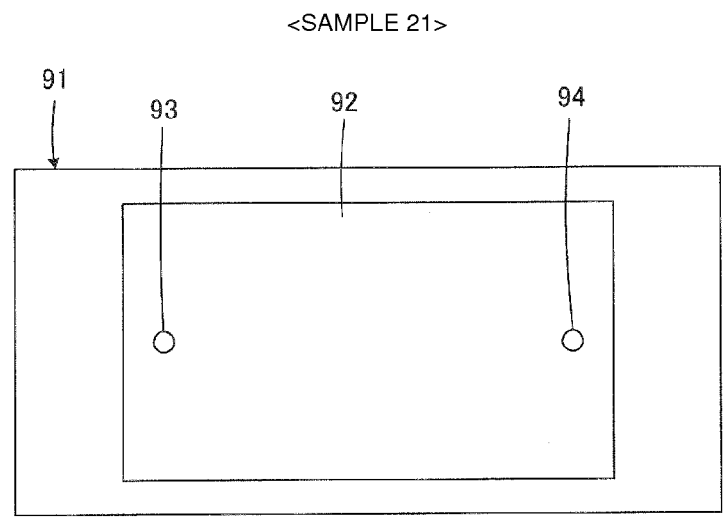
FIG. 13 illustrates a planar arrangement state of a resistance film 92, parallel connection via conductors 93 and 94 in Sample 21 manufactured in Experimental Example 3.
Figure 14:
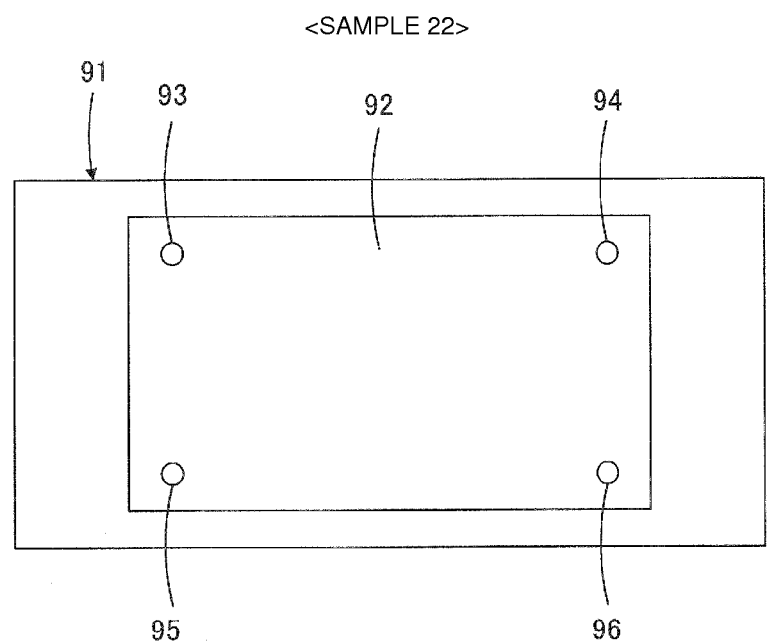
FIG. 14 illustrates a planar arrangement state of a resistance film 92 and parallel connection via conductors 93 to 96 in Sample 22 manufactured in Experimental Example 3.
Figure 15:
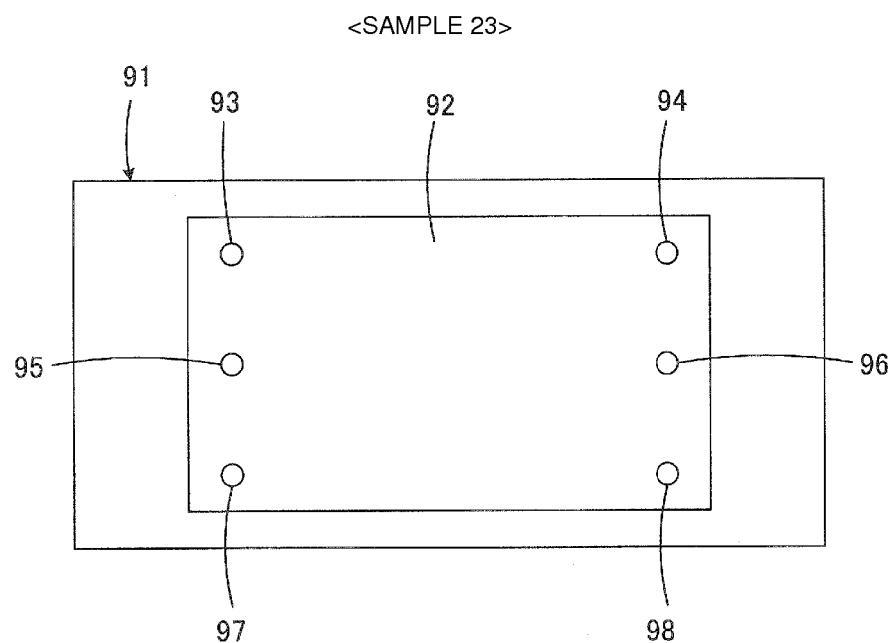
FIG. 15 illustrates a planar arrangement state of a resistance film 92 and parallel connection via conductors 93 to 98 in Sample 23 manufactured in Experimental Example 3.

In Experimental Example 3, Sample 21 illustrated in FIG. 13, Sample 22 illustrated in FIG. 14, and Sample 23 illustrated in FIG. 15, in which two resistance films were formed and the number of parallel connection via conductors that connect the resistance films in parallel were different, were manufactured, and resistance variations were compared thereamong.

In Experimental Example 3, Samples 21 to 23 were manufactured by using ceramic green sheets that were similar in the material and thickness to those adopted in Sample 1 of Experimental Example 1, forming resistance films that were similar in the material and thickness, forming lead via conductors and parallel connection via conductors that are similar in the material and dimensions, and performing firing under similar conditions.

Sample 21

As illustrated in FIG. 13, Sample 21 is a multilayer ceramic substrate in which two resistance films 92 are connected at each end by one parallel connection via conductor, that is, are connected by two parallel connection via conductors 93 and 94 in total in a ceramic element body 91.

Sample 22

As illustrated in FIG. 14, Sample 22 is a multilayer ceramic substrate in which two resistance films 92 are connected at each end by two parallel connection via conductors, that is, are connected by four parallel connection via conductors 93 to 96 in total in a ceramic element body 91.

Sample 23

As illustrated in FIG. 15, Sample 23 is a multilayer ceramic substrate in which two resistance films 92 are connected at each end by three parallel connection via conductors, that is, are connected by six parallel connection via conductors 93 to 98 in total in a ceramic element body 91.

Evaluation

Figure 16:
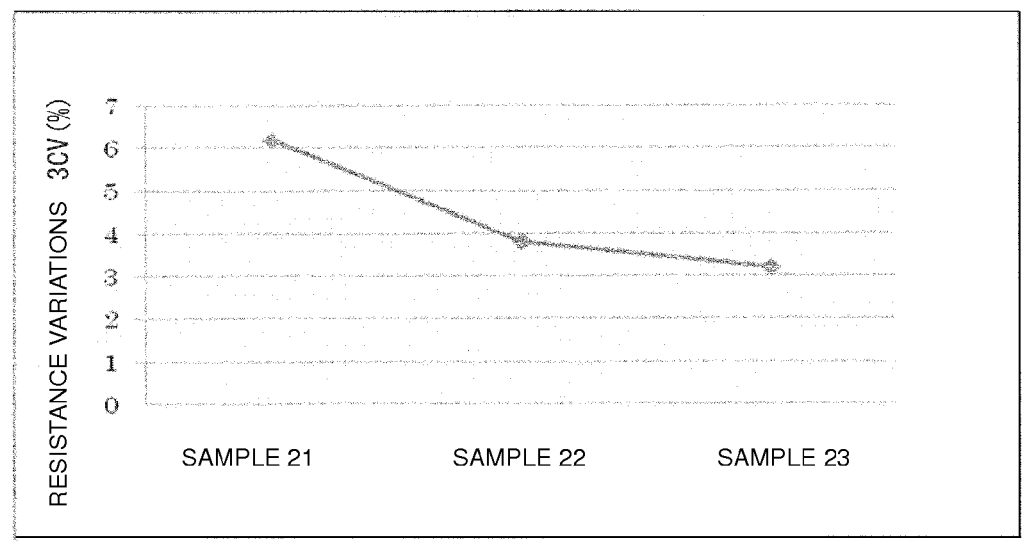
FIG. 16 illustrates resistance variations among Samples 21 to 23 manufactured in Experimental Example 3.

FIG. 16 illustrates resistance variations among Samples 21 to 23. As is known from FIG. 16, resistance variations could be made smaller as the number of parallel connection via conductors increased in the order of Samples 21, 22, and 23.

A resistor provided in the multilayer ceramic substrate according to various preferred embodiments of the present invention is arranged to be used as a current detection ultralow resistor, for example, in a remaining-battery-power detection circuit, a CPU driving current control circuit, an overcurrent detection circuit in a car air-conditioner/fan motor control unit, an overcurrent detection circuit in a switching transistor, or a current detection circuit in a CPU power supply converter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic substrate comprising: a ceramic element body including a plurality of stacked ceramic layers;
    a resistor including a resistance film disposed between at least two of the ceramic layers; and
    a lead via conductor penetrating the ceramic layers in a thickness direction and connected at a first end portion to the resistance film; wherein
    the resistance film and the lead via conductor both contain at least a first metallic component and a second metallic component that constitute an alloy resistive material; and
    a concentration of the second metallic component in the lead via conductor has a gradient structure that is comparatively high in the first end portion connected to the resistance film and gradually decreases from the first end portion toward a second end portion opposite therefrom; wherein the first metallic component is Cu and the second metallic component is Ni.

2. The multilayer ceramic substrate according to claim 1, wherein the resistor includes a plurality of the resistance films disposed between the plurality of ceramic layers, and a plurality of connection via conductors that connect the plurality of resistance films in parallel, penetrate the ceramic layers in the thickness direction, and are disposed at different positions.

3. The multilayer ceramic substrate according to claim 1, wherein the ceramic layers are mainly composed of at least one of BaO, $SiO_2$, and $Al_2O_3$.

4. The multilayer ceramic substrate according to claim 1, further comprising a connection conductor film disposed between the ceramic layers and connected to the second end portion of the lead via conductor at a first position; and a terminal conductor including a terminal via conductor connected to the connection conductor film at a second position different from the first position, penetrating the ceramic layers in the thickness direction, and led onto an outer surface of the multilayer ceramic substrate.

5. The multilayer ceramic substrate according to claim 1, further comprising first and second source terminals and first and second sense terminals; wherein
- first and second lead via conductors are electrically connected to the first and second sense terminals, respectively; and
- the first and second source terminals are electrically connected to positions of the resistance film between which connecting portions that are connected to the first and second lead via conductors are located.

6. The multilayer ceramic substrate according to claim 1, wherein a resistance of the resistor is about 100 mΩ or less.

7. The multilayer ceramic substrate according to claim 1, wherein the resistor paste includes Cu and Mn, Cu and Zn, or Ag and Pd.

8. The multilayer ceramic substrate according to claim 1, wherein the resistor paste includes at least one of Cr, M and Fe.

9. The multilayer ceramic substrate according to claim 1, further comprising a plurality of lead via conductors and a plurality of parallel connection via conductors arranged along same axes.

10. The multilayer ceramic substrate according to claim 1, further comprising a plurality of lead via conductors and a plurality of parallel connection via conductors not arranged along same axes.

11. The multilayer ceramic substrate according to claim 2, wherein a number of the connection via conductors included in the resistor is three or more.

12. The multilayer ceramic substrate according to claim 2, wherein the parallel connection via conductors are made of a same material as a material of the resistance films.

13. A manufacturing method for a multilayer ceramic substrate, comprising
- a step of preparing a plurality of ceramic green sheets; a step of preparing a resistor paste including an alloy resistive material containing a first metallic component and a second metallic component, and a conductor paste mainly composed of at least the first metallic component;
- a step of forming a lead via conductor including the conductor paste in one of the ceramic green sheets;
- a step of forming a resistance film to be connected to an end portion of the lead via conductor by the resistor paste on a principal surface of the ceramic green sheet;
- a step of forming a laminated body by stacking the plurality of ceramic green sheets; and a step of firing the laminated body; wherein the conductor paste further contains the second metallic component, and the step of preparing the conductor paste includes a step of preparing a plurality of kinds of conductor pastes that are different in a content ratio of the first metallic component and the second metallic component; the step of forming the lead via conductor includes a step of forming the lead via conductor in each of the plurality of ceramic green sheets using any of the plurality of kinds of conductor pastes to obtain a plurality of kinds of ceramic green sheets that are different in the content ratio of the first metallic component and the second metallic component in the lead via conductor; and the step of forming the laminated body includes a step of stacking the plurality of ceramic green sheets such that the ceramic green sheet including the lead via conductor with a highest content of the second metallic component is located on a side connected to the resistance film and such that the ceramic green sheets are arranged from the resistance film in order of decreasing content of the second metallic component in the lead via conductor, and wherein the first metallic component is Cu and the second metallic component is Ni.

14. The manufacturing method for the multilayer ceramic substrate according to claim 13, wherein a resistance of the resistor is about 100 mΩ or less.

15. The manufacturing method for the multilayer ceramic substrate according to claim 13, wherein the resistor paste includes Cu and Mn, Cu and Zn, or Ag and Pd.

16. The manufacturing method for the multilayer ceramic substrate according to claim 13, wherein the resistor paste includes at least one of Cr, M and Fe.

17. The manufacturing method for the multilayer ceramic substrate according to claim 13, further comprising a plurality of lead via conductors and a plurality of parallel connection via conductors arranged along same axes or shifted from each other.

* * * * *